United States Patent [19]
Kanetaka et al.

[11] Patent Number: 5,764,126
[45] Date of Patent: Jun. 9, 1998

[54] CHIP COIL

[75] Inventors: Toyonori Kanetaka; Mikio Taoka; Toshihiro Yoshizawa, all of Osaka, Japan

[73] Assignee: Matsushita Electric Industrial Co., Ltd., Osaka, Japan

[21] Appl. No.: 776,061

[22] PCT Filed: May 31, 1996

[86] PCT No.: PCT/JP96/01476

§ 371 Date: Apr. 3, 1997

§ 102(e) Date: Apr. 3, 1997

[87] PCT Pub. No.: WO96/42094

PCT Pub. Date: Dec. 27, 1996

[30] Foreign Application Priority Data

Jun. 8, 1995 [JP] Japan .................................. 7-141546

[51] Int. Cl.⁶ .............................. H01F 27/29; H01F 27/30
[52] U.S. Cl. .................... 336/96; 333/185; 336/192; 336/200; 336/223; 361/811; 361/821

[58] Field of Search ...................... 361/811, 821; 336/223, 96, 192, 200, 65; 333/184, 185

[56] References Cited

FOREIGN PATENT DOCUMENTS

| | | |
|---|---|---|
| 54-140164 | 10/1979 | Japan . |
| 57-48216 | 3/1982 | Japan . |
| 2-52408 | 2/1990 | Japan . |
| 4-101404 | 4/1992 | Japan . |

*Primary Examiner*—Thomas J. Kozma
*Attorney, Agent, or Firm*—McDermott, Will & Emery

[57] ABSTRACT

The present invention relates to a chip coil for use in the electronic appliance or such other equipment, and intended to present a chip coil of an excellent mounting capability. Recesses (6) are provided only in the top and bottom surfaces of main body (1) having a square pillar shape, and in the bottom surface of main body (1) an insulation resin (4) is provided in the recess (6) to cover coil (2) within the space of recess (6).

4 Claims, 7 Drawing Sheets

CHIP COIL

TECHNICAL FIELD

The present invention relates to a chip coil for use in the electronic appliance, communication apparatus, etc.

BACKGROUND ART

Shown in FIG. 6 is a perspective view of a conventional chip coil having spiral groove. Where, numeral 11 denotes a main body of square pillar shape around which a conductive member is provided on an insulating surface. Numeral 12 is a coil formed by spirally grooving the conductive surface layer of main body 11, 14 an insulation resin coated over the surface of coil 12, and 15 terminals of coil 12.

In a chip coil having a constitution as shown in the above FIG. 6, the surfaces of terminals 15 and the surface of the insulation resin 14 do not have complete flatness because the thickness of insulation resin 14 covering the main body 11 for an area between the terminals 15 is greater than the thickness of the terminals 15 located at both ends of main body 11. As a result, when a chip coil is mounted on a printed circuit board or the like the flatness between the surface of printed circuit board and the mounting surface of the chip coil is not secured, inviting a poor solderability between the terminal 15 and the printed circuit board or the like; which was a cause of mounting defects. What is shown in FIG. 7 is a chip coil proposed to solve the above drawbacks. The chip coil of FIG. 7 is provided with recesses 16 in the front, rear, top and bottom faces of the circumferential surface of main body 11 in an area between the terminals 15. With the above constitution, even in a case where insulation resin 14 is provided to cover the circumferential surface of main body 11 for an area between terminals 15, the insulation resin 14 is housed within recesses 16, and the flatness of the surfaces of terminals 15 and that of the surface of insulation resin 14 is improved to be better than that of a chip coil of FIG. 6, as a result the occurrence of mounting defects diminishes.

In the above constitution, however, as the main body 11 is provided with recesses 16 in the front, rear, top and bottom faces, it is not easy to take the main body 11 out of mould when manufacturing the main body through a moulding process; which is an adverse factor against the productivity. Furthermore, the recesses 16 provided in the front, rear, top and bottom faces of main body 11 reduce the cross sectional area of main body 11; accordingly the inductance which is subject to the cross sectional area of main body 11 also becomes smaller.

DISCLOSURE OF THE INVENTION

The present invention is intended to solve the above described problems, and presents a chip coil with which the mounting defects are reduced, a high productivity is preserved, at the same time the decrement in inductance is minimized.

In order to implement the above objective, a chip coil according to the present invention comprises a main body of an insulation material having a shape of square pillar, terminals provided at both ends of the main body, a coil connected with the terminals and disposed around the circumferential surface of the main body in an area between the terminals, and an insulation resin covering the coil; wherein the coil is formed by grooving off the insulation layer covering the surface of the main body, recesses are provided only at the top and bottom faces of the circumferential surface of the main body, and at the bottom surface of the main body the insulation resin is provided within the recess.

In the above described constitution, as the insulation resin is disposed within the bottom recess of the main body, an excellent flatness is secured at the bottom surface of the main body, rendering it difficult to cause mounting defects.

Furthermore, as there is no recess in the front and the rear of the main body it is easy to take the main body out of mould, which provides an improved productivity, and limits the decrease of cross sectional area of the main body, hence the decrease of inductance.

BEST MODE FOR CARRYING OUT THE INVENTION

Figure 1A:
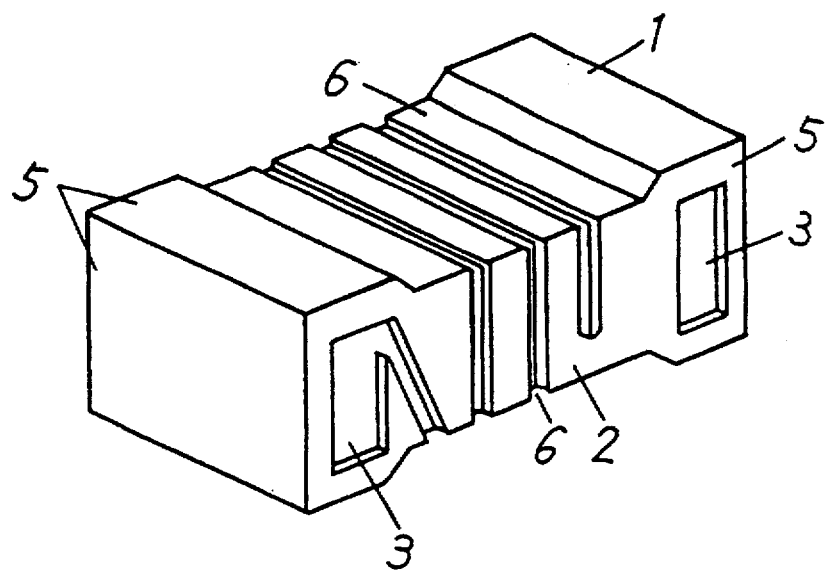
FIG. 1(a) is a perspective view showing a chip coil, before coating of insulation resin, according to a first embodiment of the present invention.
Figure 1B:
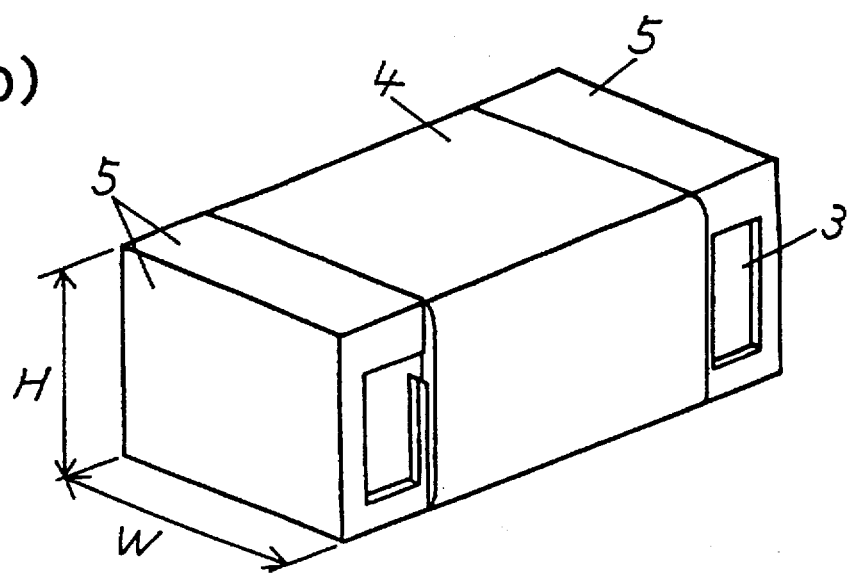
FIG. 1(b) is a perspective view showing the chip coil FIG. 1(a), after coating of insulation resin.

A first embodiment of the present invention is described in the following referring to drawings. In FIG. 1(a), numeral 1 denotes a main body made of a material having insulating property shaped in a square pillar lying horizontal and provided with a conductive layer over the surface, 2 a coil formed by spirally grooving off the conductive layer around the circumferential surface of main body 1, 3 eliminations formed by eliminating a part of the front face of terminals 5 disposed at both ends of main body 1, and 6 recesses provided only in the top and bottom faces of the circumferential surface of main body 1. In FIG. 1(b), numeral 4 denotes an insulation resin applied on the outer surface of coil 2.

Symbol H represents the height, and W the width of main body 1; where, H is 0.7 mm, W is 0.5 mm.

As shown in FIGS. 1(a),(b), the chip coil comprises main body 1 of insulating material having a square pillar shape, terminals 5 disposed at both ends of main body 1 in the top, bottom, front, rear and sectional faces, coil 2 disposed around the circumferential surface of main body 1 and connected with the terminals 5, and insulation resin 4 covering the coil 2.

The coil 2 is formed by grooving off the conductive layer covering the circumferential surface of main body 1. In the circumferential surface of main body 1, only the top and bottom faces are provided with recesses 6; in the top and bottom faces of main body 1, the insulation resin 4 covers coil 2 within the space of recesses 6.

In the right and left front faces of terminals 5, the eliminations 3 are provided.

Now in the following, the operation of a chip coil having the above constitution is described.

The main body 1 is given with an orientation with respect to the top and bottom faces in a state prior to application of insulation resin 4 as shown in FIG. 1(a). Namely, in the state as shown in FIG. 1(a), the recesses 6 are exposed at the top and bottom faces of main body 1 as the insulation resin 4 is not yet applied to; therefore the main body 1 is orientated through detection of recesses 6, so as the recesses 6 are positioned at the top and bottom faces, and then, in this state, the coil 2 is covered with insulation resin 4, and taped. During the above described procedure, the accuracy in directional orientation is improved because the positioning of main body 1 is correctable by the recesses 6.

Although the terminals 5 are disposed at both ends of main body 1 having recesses 6, the flatness between the surfaces of terminals 5 and insulation resin 4 is assured because the insulation resin 4 is provided only within the recess 6 provided in the bottom face between the terminals 5. This contributes in preventing mounting defects when mounting a chip on a printed circuit board or the like.

Furthermore, the cross sectional area of main body 1 is not much reduced because no recess 6 is provided at the front and rear faces of the circumferential surface of main body 1; and the main body 1 can easily be taken out of mould during the moulding process because there is no recess 6 at the front and rear faces, which results in an improved productivity.

In addition, because of eliminations 3 provided by eliminating a part of the terminals 5, adjusting of the inductance and improving of the unloaded Q characteristic can be made simply by controlling the degree of eliminating the part of terminals 5.

Figure 2:
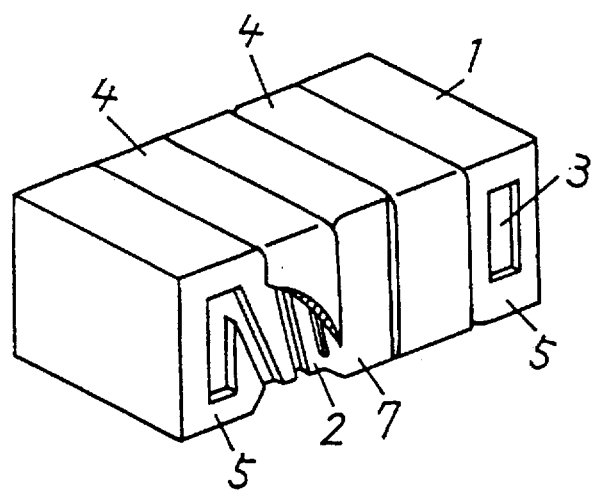
FIG. 2 is a partially cutaway perspective view of a chip coil according to a second embodiment of the present invention.
Figure 3:
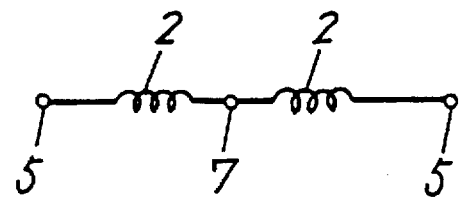
FIG. 3 is an electrical equivalent circuit diagram of the chip coil of FIG. 2.

Next, a second embodiment of the present invention is described referring to FIG. 2 and FIG. 3. The chip coil of FIG. 2 is a chip coil of FIG. 1, in which an intermediate terminal 7 is provided in the middle of coil 2 and made to be exposing out of the insulation resin 4. FIG. 3 shows an electrical equivalent circuit diagram of the above chip. With the above described constitution, the main body 1 contains two of the coil 2, and the mounting density is raised.

Figure 4:
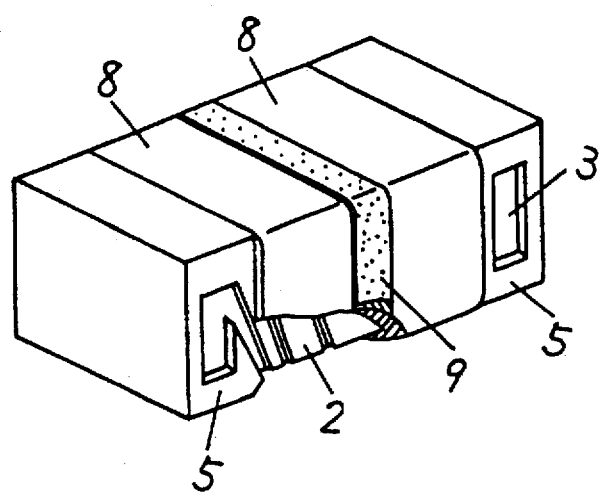
FIG. 4 is a partially cutaway perspective view of a chip coil according to a third embodiment of the present invention.
Figure 5:
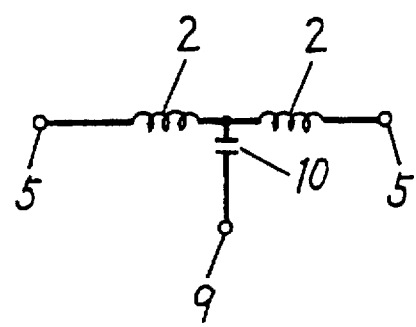
FIG. 5 is an electrical equivalent circuit diagram of the chip coil of FIG. 4.
Figure 6:
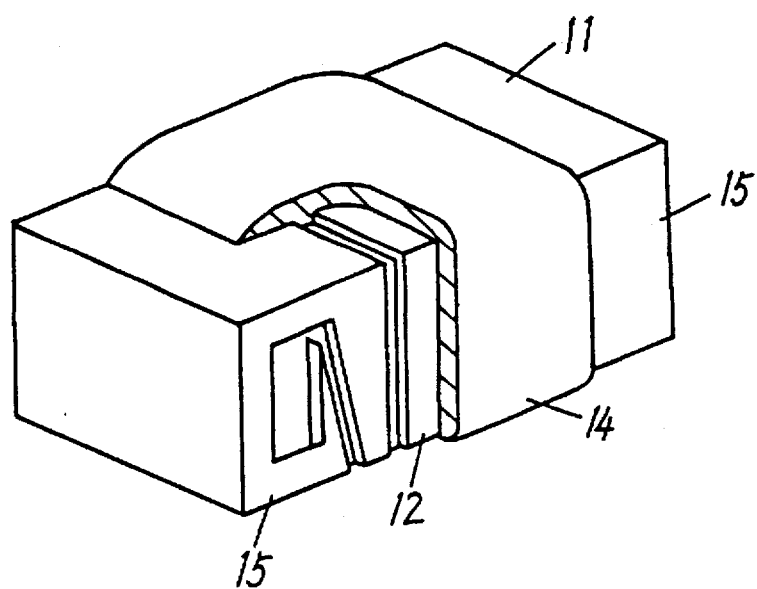
FIG. 6 is a partially cutaway perspective view of a prior art chip coil.
Figure 7:
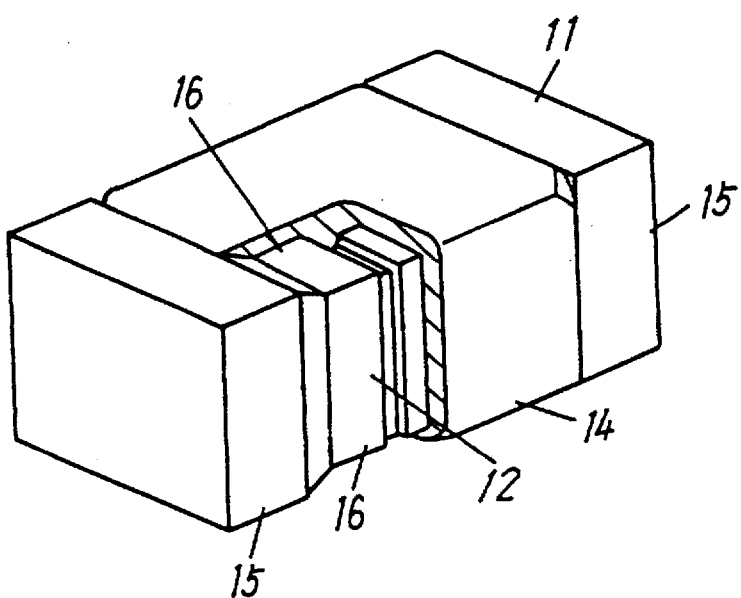
FIG. 7 is a partially cutaway perspective view of other prior art chip coil.

Next, a third embodiment of the present invention is described referring to FIG. 4 and FIG. 5. The chip coil of FIG. 4 is a chip coil of FIG. 1, in which the insulation resin 4 covering the surface of coil 2 is replaced with a dielectric resin 8, and a conductive terminal 9 is provided on the surface in a belt form. An electrical equivalent circuit diagram of the above chip is as shown in FIG. 5. By the above described constitution, a capacitor is formed between coil 2 and conductive terminal 9, as a result one chip coil additionally provides a filter function based on two of the coil 2 and capacitor 10.

INDUSTRIAL APPLICABILITY

According to the present invention, recesses are provided only in the top and bottom faces of the circumferential surface of a main body, and insulation resin is provided at the bottom surface within the recess, as a result the flatness of the bottom surface of the main body is improved, and the occurrence of mounting defects is prevented.

As there is no recess provided in the front and rear faces of the circumferential surface of the main body the cross sectional area of the main body is not much diminished and the inductance is not reduced; furthermore, as there is no recess in the front and rear faces of the main body the main body can easily be taken out of mould while processing with moulds, so the productivity is improved.

Furthermore, because of the elimination provided by eliminating a part of the terminal the adjusting of inductance and the improvement of unloaded Q characteristic can be made by adjusting the degree of eliminating the elimination 3.

Furthermore, by providing an intermediate terminal in the middle of coil and making the intermediate terminal exposed out of insulation resin, the main body can contain two of the coil to an increased mounting density.

In addition, by replacing the insulation resin covering the surface of coil with a dielectric resin and providing a conductive terminal of a belt form on the surface of dielectric resin, a capacitor is formed between the coil and the conductive terminal; thus one chip coil can additionally have a filter function based on two of the coil and the capacitor.

We claim:

1. A chip coil comprising:

a main body of square pillar shape comprised of an insulating material, terminals provided at both ends of said main body, a coil connected with said terminals and provided around a circumferential surface of said main body in an area between said terminals, and an insulation resin covering said coil; wherein said coil is formed by grooving off a conductive layer covering the surface of said main body, recesses are provided only in the top and bottom faces of the circumferential surface of said main body, and in the bottom face of said main body said insulation resin is provided within said recess.

2. A chip coil comprising:

a main body of square pillar shape comprised of an insulating material, terminals provided at both ends of said main body, a coil connected with said terminals and provided around a circumferential surface of said main body in an area between said terminals, and an insulation resin covering said coil; wherein said coil is formed by grooving off a conductive layer covering the surface of said main body, recesses are provided only in the top and bottom faces of the circumferential surface of said main body, in the bottom face of said main body said insulation resin is provided within said recess, and an elimination is provided at the end of the front face or the rear face of said terminals by eliminating a part of said terminals.

3. A chip coil comprising:

a main body of square pillar shape comprised of an insulating material, terminals provided at both ends of said main body, a coil connected with said terminals and provided around a circumferential surface of said main body in an area between said terminals, and an insulation resin covering said coil; wherein said coil is formed by grooving off a conductive layer covering the surface of said main body, recesses are provided only in the top and bottom faces of the circumferential surface of said main body, in the bottom face of said main body said insulation resin is provided within said recess, and an intermediate terminal is provided in a middle of said coil and is made to be exposing out of the insulation resin.

4. A chip coil comprising:

a main body of square pillar shape comprised of an insulating material, terminals provided at both ends of said main body, a coil connected with said terminals and provided around a circumferential surface of said main body in an area between said terminals, and a dielectric resin covering said coil; wherein said coil is formed by grooving off a conductive layer covering the surface of said main body, recesses are provided only in the top and bottom faces of circumferential surface of said main body, in the bottom face said dielectric resin is provided within said recess, and a conductive terminal is provided in a belt form on the surface of said dielectric resin.

* * * * *